United States Patent [19]
Hirokawa et al.

[11] Patent Number: 5,353,323
[45] Date of Patent: Oct. 4, 1994

[54] X-RAY EXPOSURE APPARATUS

[75] Inventors: Toshio Hirokawa, Kawasaki; Norio Uchida, Yokohama, both of Japan

[73] Assignee: Kabushiki Kaisha Toshiba, Kawasaki, Japan

[21] Appl. No.: 190,531

[22] Filed: Feb. 2, 1994

[51] Int. Cl.$^5$ .............................. G21K 5/00
[52] U.S. Cl. ............................ 378/34; 378/35
[58] Field of Search ......................... 378/34, 35

[56] References Cited

U.S. PATENT DOCUMENTS

| | | | |
|---|---|---|---|
| 5,172,403 | 12/1992 | Tanaka et al. | 378/34 |
| 5,267,292 | 11/1993 | Tanaka et al. | 378/34 |

FOREIGN PATENT DOCUMENTS 1-181518  7/1989  Japan .

OTHER PUBLICATIONS

S. Ishihara, et al., J. Vac. Sci. Technol. B 7(6), Nov./Dec. 1989, pp. 1652–1656, "A Vertical Stepper for Synchrotron X-Ray Lithography."

*Primary Examiner*—David P. Porta
*Assistant Examiner*—Don Wong
*Attorney, Agent, or Firm*—Oblon, Spivak, McClelland, Maier & Neustadt

[57] ABSTRACT

Disclosed is an X-ray exposure apparatus comprising a chamber, filled with X-ray low attenuation gas for guiding X-rays, generated from an X-ray source, to an X-ray window, a gas supplying portion, provided to supply X-ray low attenuation gas into the chamber and having a portion with a small-diameter passage cross section formed at least at a part thereof, a gas discharging portion, provided to discharge gas from the chamber and having a portion with a small-diameter passage cross section formed at least at a part thereof, and a flow-rate controller for controlling a flow rate of the gas to be supplied to the gas supplying portion to thereby control pressure in the chamber, whereby pressure in the chamber is made equal to or slightly higher than atmospheric pressure by setting the small-diameter portion of the gas supplying portion smaller than that of the gas discharging portion.

12 Claims, 6 Drawing Sheets

X-RAY EXPOSURE APPARATUS

BACKGROUND OF THE INVENTION

1. Field of the Invention

The present invention relates to an X-ray exposure apparatus which exposes a semiconductor wafer or the like using X-rays that are generated by the radiation of a synchrotron (SOR) or electron-ray excitation, or X-rays that are generated by plasma or the like.

2. Description of the Related Art

Recent semiconductor devices are designed with higher integration so that the minimum line width of the pattern of a VLSI (Very Large Scale Integration) circuit reaches the order of submicrons. Exposure apparatuses, which are used in fabricating VLSI devices, expose a semiconductor wafer or the like using X-rays that are generated by the radiation of a synchrotron (SOR) or electron-ray excitation, or X-rays that are generated by plasma or the like.

Such an X-ray exposure apparatus is designed in such a way that X-rays, which are generated from an X-ray source placed in vacuum and are led into a chamber filled with gaseous helium through a window formed by a beryllium foil, transfers a mask pattern on a wafer, placed in the air, through an X-ray mask.

Since the attenuation of X-rays is significant in this X-ray exposure apparatus, it is necessary to keep the low-attenuation atmosphere for X-rays (helium atmosphere) at high purity. As the X-ray mask are very thin, the difference between the pressure in the chamber and the atmospheric pressure should be controlled at high precision in order to prevent those members from being deformed or damaged.

A helium chamber for an X-ray exposure apparatus, as disclosed in Jpn. Pat. Appln. KOKAI Publication No. 1-181518 and Jpn. Pat. Appln. KOKAI Publication No. 1-181521, has been proposed as one conventional technique of controlling the chamber pressure.

In this conventional technique, the difference between the chamber pressure and atmospheric pressure can be controlled to about +3 mmH$_2$O or +0.2 mmHg due to the difference in specific weight between H$_2$O and Hg being 1:13.6). However, the present inventors have conducted various experiments and simulation and found that with the difference between the chamber pressure and atmospheric pressure being 0.2 mmHg, a typical X-ray mask, e.g., an X-ray mask having a membrane thickness of 1 $\mu$m and a size of about 25 mm on each side, causes deformation of about 15 $\mu$m. In the X-ray exposure apparatus, it is considered to perform a close exposure with the gap between the mask and the wafer being set to about 30 $\mu$m. If the mask deforms 15 $\mu$m for the 30-$\mu$m gap, accurate exposure will not be accomplished.

In a pressure control of about 0.2 mmHg, as described above, since the amount of mask deformation is too large, an accurate exposure cannot be realized. For this reason, finer control on the pressure difference is demanded.

Also, in a case of monitoring oxygen concentration, if the oxygen concentration in the chamber is measured by an oxygen monitor with a suction pump for sucking sample gas, the pressure in the chamber varies. For this reason, it is difficult to satisfy the above demand for the pressure control.

SUMMARY OF THE INVENTION

It is therefore an object of the present invention to provide an X-ray exposure apparatus which will control the pressure in a chamber at high precision.

It is another object of the present invention to provide an X-ray exposure apparatus which will substantially eliminate the difference between the chamber pressure and atmospheric pressure.

To achieve the foregoing objects, according to one aspect of this invention, there is provided an X-ray exposure apparatus comprising a chamber, filled with an x-ray low attenuation gas, for guiding X-rays, generated from an X-ray source, to an X-ray window; a gas supplying portion, provided to supply an X-ray low attenuation gas into the chamber and having a portion with a small-diameter passage cross section formed at least at a part thereof; a gas discharging portion, provided to discharge gas from the chamber and having a portion with a small-diameter passage cross section formed at least at a part thereof; and flow-rate control means for controlling a flow rate of the gas to be supplied to the gas supplying portion to thereby control pressure in the chamber, whereby pressure in the chamber is made equal to or slightly higher than atmospheric pressure by setting the small-diameter portion of the gas supplying portion smaller than that of the gas discharging portion.

According to another aspect of this invention, there is provided an X-ray exposure apparatus comprising a chamber, for guiding X-rays, generated from an X-ray source, to an X-ray attenuation atmosphere from an X-ray window to a mask; a gas supplying portion for supplying an X-ray low attenuation gas into the chamber; and a gas discharging portion, provided to discharge gas from the chamber and having a gas outlet port formed at substantially the same height as a mask for making pressure in the chamber substantially equal to atmospheric pressure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
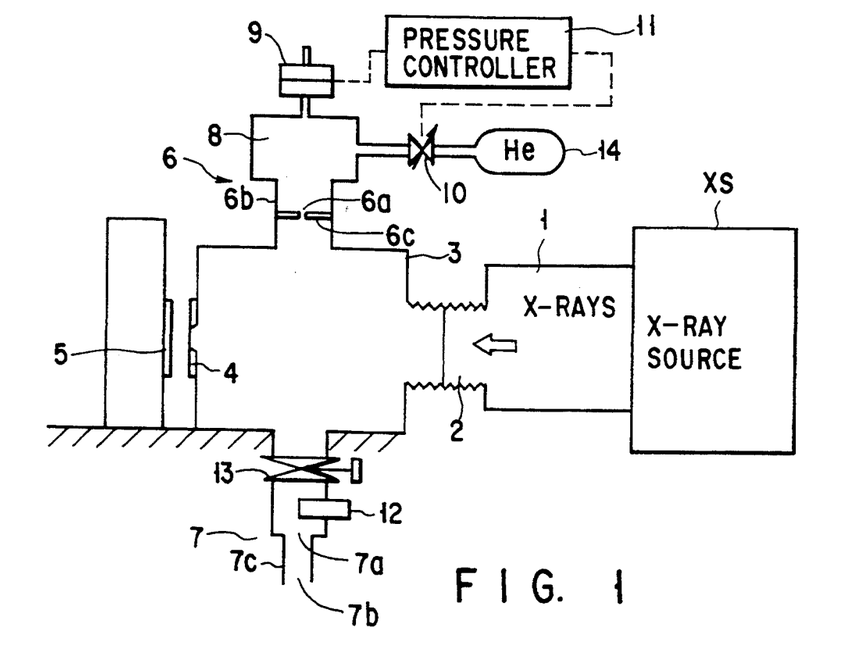
FIG. 1 is a diagram of one embodiment of the present invention, illustrating the schematic structure of an X-ray exposure apparatus having a gas supplying portion with a small-diameter portion formed at a part thereof and a gas discharging portion.

According to an embodiment shown in FIG. 1, an X-ray window (beryllium foil) 2 is provided between a vacuum chamber 1 where X-rays emitted from an X-ray source XS enter, and a chamber 3. The chamber 3 is filled with high-purity gaseous helium to provide an X-ray low attenuation atmosphere. An X-ray mask 4 having a pattern of an LSI circuit or the like drawn thereon is disposed between the chamber 3 and the air, facing the X-ray window 2. A wafer 5 for example is placed in the air, opposite to the X-ray mask 4. Provided above the chamber 3 is a gas supplying portion 6 for guiding gaseous helium inside the chamber 3. Provided below the bottom portion of the chamber 3 is a gas discharging portion 7 for discharging gaseous helium out of the chamber 3.

The gas supplying portion 6 has a pressure control chamber 8 having a relatively large volume and a restrictor 6c, which is provided in a pipe 6b for connecting this pressure control chamber 8 to the chamber 3. The restrictor 6c has an orifice 6a having a smaller diameter a than that of the pipe 6b. Provided above the pressure control chamber 8 is a differential pressure gauge 9 which measures the difference between pressure in the pressure control chamber 8 and atmospheric pressure. A helium tank 14 is connected to the side of the pressure control chamber 8 via a flow-rate control valve 10, which may be an electromagnetic valve. The flow-rate control valve 10 is connected to a pressure controller 11. The pressure controller 11 is connected to the differential pressure gauge 9, and controls the flow-rate control valve 10 based on the output signal of the differential pressure gauge 9 to adjust the flow rate of the gaseous helium to be supplied to the pressure control chamber 8.

The gas discharging portion 7, connected to the chamber 3, has a restrictor 7a having a larger diameter b than the diameter a of the orifice 6a (i.e., a<b), an oxygen analyzer 12, a shield valve 13, a lead pipe 7c extending downward of the restrictor 7a, and an opening (outlet port) 7b open to the air. The shield valve 13 and oxygen analyzer 12 are located upstream of the restrictor 7a.

The operation of the thus structured X-ray exposure apparatus will be described below.

The X-ray source XS is activated to emit X-rays in the vacuum chamber 1. The X-rays pass through the X-ray window 2, the X-ray low attenuation atmosphere of the chamber 3 and the mask 4 to transfer the LSI pattern of the mask 4 on the wafer 5. At this time, the differential pressure gauge 9 measures the difference between the pressure in the pressure control chamber 8 and atmospheric pressure and inputs the pressure difference signal to the pressure controller 11. The pressure controller 11 controls the opening of the flow-rate control valve 10 in accordance with the pressure difference signal. Accordingly, some amount Q of gaseous helium is supplied via the flow-rate control valve 10 to the pressure control chamber 8 from the helium tank 14.

In this case, if the pressure in the pressure control chamber 8 is controlled to be $P_0$, the pressure $P_1$ in the chamber 3 will be expressed by the following equation.

$$P_1 \approx P_0 (a/b)^4$$

where a is the diameter of the orifice 6a and b is the diameter of the restrictor 7a.

Thus, if $P_0 = 1$ mmHg, $a = 1$ mm and $b = 10$ mm, it is apparent from the above equation that the minute pressure difference of 1/10000 mmHg ($10^{-4}$ mmHg) is attained between the pressure $P_1$ in the chamber 3 and the atmospheric pressure.

With a typical X-ray mask (membrane thickness of 1 $\mu$m and a size of 25 mm on each side), if the pressure difference between the pressure $P_1$ in the chamber 3 and the atmospheric pressure is set to about 1/1000 mmHg ($10^{-3}$ mmHg), the amount of deformation of the mask will be suppressed to about 0.5 $\mu$m. Even with the use of an X-ray mask that is easy to deform, the amount of deformation will be suppressed to about 1 to 2 $\mu$m for that pressure difference. If the pressure $P_1$ in the chamber 3 is set slightly higher than the atmospheric pressure by about 1/10000 mmHg, therefore, the amount of deformation of the X-ray mask 4 can be suppressed significantly, thus ensuring adequate exposure at a sufficiently high accuracy even in the case of close exposure with the gap of about 30 $\mu$m set between the mask 4 and the wafer 5.

The place in the X-ray exposure apparatus where one wants to measure the oxygen concentration is inside the chamber 3 where the purity of helium should be concerned. If the oxygen analyzer 12 is provided at the gas discharging portion 7 for gaseous helium as in the above-described embodiment, the oxygen concentration in the chamber 3 would always be monitored without directly measuring that oxygen concentration and no pump is needed to suck sample gas. In other words, as the chamber 3 has no portion open to the air except the gas discharging portion 7, it is assured that the oxygen concentration in the chamber 3 located upstream of the gas discharging portion 7 will be equal to or lower than the oxygen concentration at the gas discharging portion 7, if the oxygen concentration is measured at the outlet port of the gas discharging portion 7.

The most probable cause for an increase in oxygen concentration in the chamber 3 is the diffusion of oxygen near the gas discharging portion 7, which is prevented by the lead pipe 7c located between the restrictor 7a and the opening 7b in the above embodiment.

when no gaseous helium flows when the apparatus is activated or deactivated, the shield valve 13 can shield the inside of the chamber 3.

Figure 2:
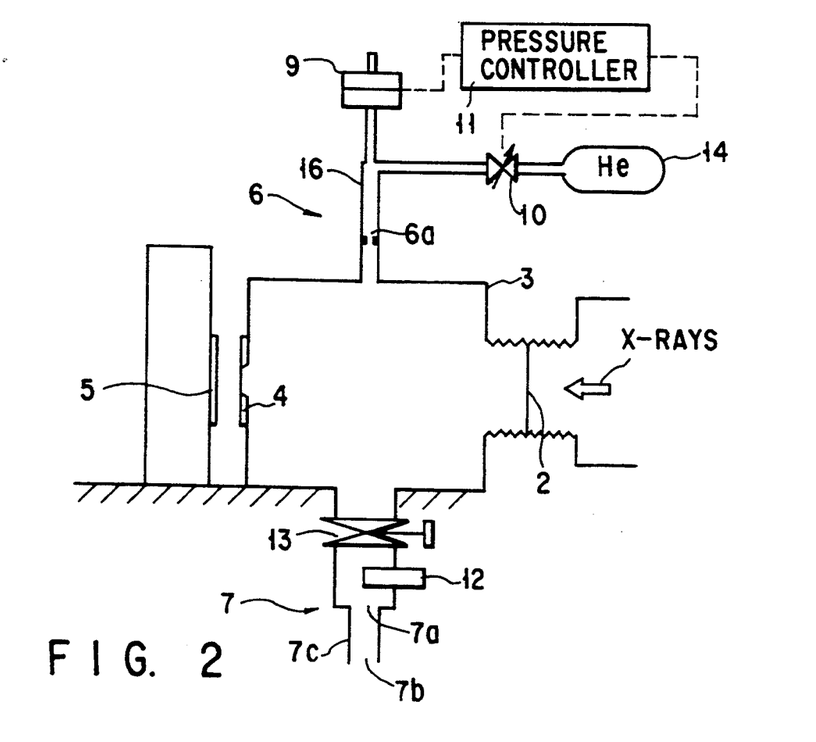
FIG. 2 is a diagram showing the schematic structure of an X-ray exposure apparatus having a small-diameter gas supplying portion according to another embodiment of this invention.

Although the pressure control chamber 8 is provided in the above embodiment, it may be replaced with a pipe 16 as shown in FIG. 2. Although the pressure control chamber 8 needs a certain volume to provide uniform pressure, it may be replaced with a simple pipe 16. In this case, when the diameter of the pipe 16 is larger than the diameter a of the orifice 6a, it is necessary to form a restrictor corresponding to the orifice 6a as shown in FIG. 2. If the diameter a of the orifice 6a is equal to that of the pipe 16, the pipe 16 alone will accomplish the same function as the orifice 6a in the embodiment in FIG. 1. This eliminates the need for separately providing the orifice 6a to the pipe 16, thus simplifying the structure.

Another embodiment will now be described referring to FIG. 3.

Figure 3:
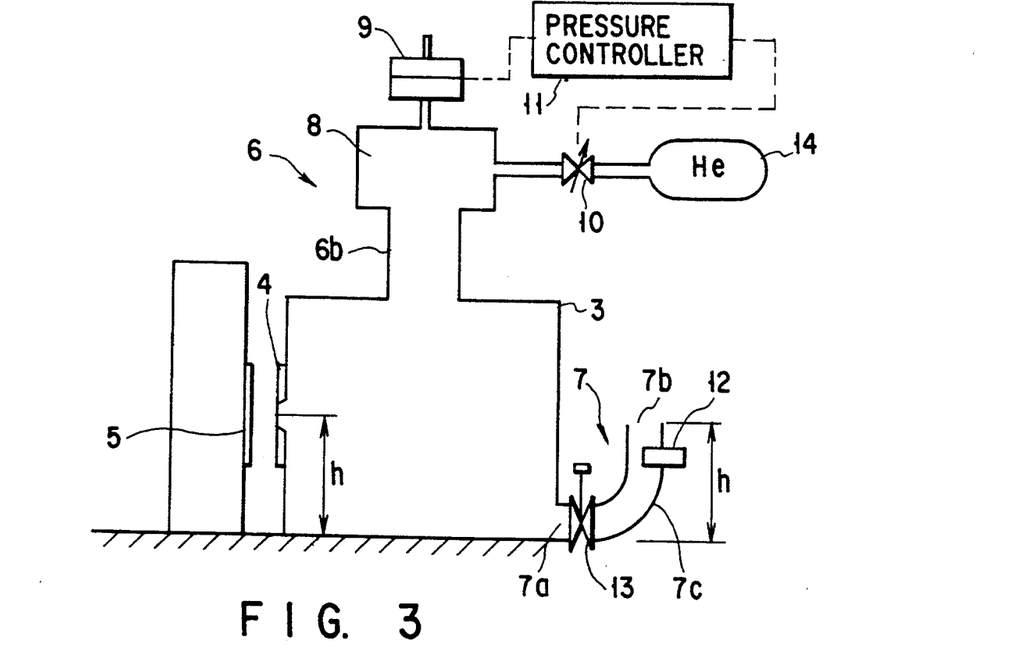
FIG. 3 is a diagram illustrating the schematic structure of an X-ray exposure apparatus having a gas discharging portion with an outlet port located at the same height as a mask according to a different embodiment of this invention.

While the X-ray source XS, vacuum chamber 1 and X-ray window (beryllium foil) 2 are not shown in FIG. 3 for the sake of convenience, the structures and arrangement of those members are the same as those of the first embodiment. In the diagram, as per the previous embodiment, the chamber 3 is filled with highly pure gaseous helium to provide an X-ray low attenuation atmosphere. An X-ray mask 4 having a pattern of an LSI circuit or the like drawn thereon is disposed between the chamber 3 and the air, facing the X-ray window 2. A wafer 5 for example is placed in the air, opposite to the X-ray mask 4. Provided above the chamber 3 is a gas supplying portion 6 for guiding gaseous helium inside the chamber 3. Provided at the side of the bottom portion of the chamber 3 is a gas discharging portion 7 for discharging gaseous helium out of the chamber 3.

The gas supplying portion 6 has a pressure control chamber 8 having a relatively large volume and a pipe 6b, which connects this pressure control chamber 8 to the chamber 3. Provided above the pressure control chamber 8 is a differential pressure gauge 9 which measures the difference between pressure in the pressure control chamber 8 and atmospheric pressure. A helium tank 14 is connected to the side of the pressure control chamber 8 via a flow-rate control valve 10, which may be an electromagnetic valve. The flow-rate control valve 10 is connected to a pressure controller 11. The pressure controller 11 is connected to the differential pressure gauge 9, and controls the flow-rate control valve 10 based on the output signal of the differential pressure gauge 9 to adjust the flow rate of the gaseous helium to be supplied to the pressure control chamber 8.

The gas discharging portion 7, connected to the side of the bottom portion of the chamber 3, has a pipe 7c extending upward from the bottom portion. This pipe 7a has an upward opening (outlet port) 7b formed at the same height as the height h from the bottom of the chamber 3 to nearly the center of the mask 4. A shield valve 13 is provided where the pipe 7c is connected to the chamber 3. An oxygen analyzer 12 is attached to the pipe 7 near the opening 7b.

In the X-ray exposure apparatus having the above structure, if the atmospheric pressure is $P_0$, the pressure in the chamber 3 is $P_1$ and the difference between the height of the mask 4 and that of the opening 7b is $\Delta h$ (cm), the pressure difference that occurs due to the height difference will be given by the following equation.

$$P_1 - P_0 = (\gamma_{air} - \gamma_{He}) \cdot \Delta h$$

where $\gamma_{air}$ air is the specific weight of air and $\gamma_{He}$ is the specific weight of helium.

For example, with the height difference $\Delta h = 10$ cm and $$\gamma_{air} = 1.293 \times 10^{-6} \, (Kg/cm^3)$$

$$\gamma_{He} = 0.179 \times 10^{-6} \, (Kg/cm^3),$$

then a pressure difference of $$\begin{aligned} P_1 - P_0 &= 1.12 \times 10^{-5} \, (Kg/cm^3) \\ &= 8.5 \times 10^{-3} \, (mmHg) \end{aligned}$$

would be produced. In view of the amount of deformation of the mask 4, it is desirable that the opening 7b be located at the same height as the height (h) from the bottom of the chamber 3 to nearly the center of the mask 4. The allowance of the height difference $\Delta h$ should be properly set in accordance with the type of the mask based on the above equations.

In the thus constituted X-ray exposure apparatus, a predetermined amount of gaseous helium is supplied to the chamber 3 via the valve 10, pressure control chamber 8 and pipe 6b from the helium tank 14. At this time, the differential pressure gauge 9 measures the difference between the pressure in the pressure control chamber 8 and atmospheric pressure and inputs the pressure difference signal to the pressure controller 11. The pressure controller 11 controls the opening of the flow-rate control valve 10 in accordance with the pressure difference signal. Accordingly, gaseous helium whose quantity corresponds to the pressure difference is supplied via the flow-rate control valve 10 to the pressure control chamber 8 from the helium tank 14. The gaseous helium supplied to the chamber 3 is properly discharged through the gas discharging portion 7. In this case, since the height from the bottom of the chamber 3 to the opening 7b is about the same as the height from the bottom of the chamber 3 to the center of the mask, the pressure in the chamber 3 becomes approximately equal to the atmospheric pressure as apparent from the above-given equation. Accordingly, the X-ray mask 4 will hardly deform, thus ensuring adequate exposure at a sufficiently high accuracy even in the case of close exposure with the gap of about 30 μm set between the mask 4 and the wafer 5.

Figure 4:
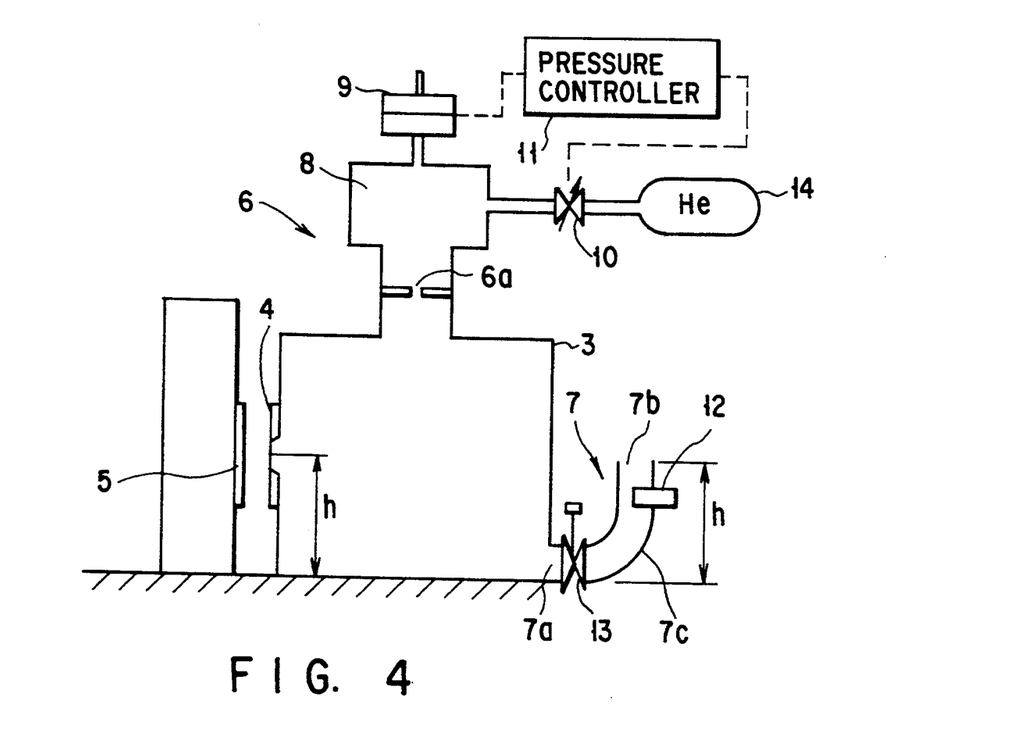
FIG. 4 is a diagram illustrating the schematic structure of an X-ray exposure apparatus having a gas discharging portion with an outlet port located at the same height as a mask according to a still different embodiment of this invention.

FIG. 4 shows an embodiment which has a restrictor 6c with an orifice 6a further provided to the pipe 6b of the embodiment shown in FIG. 3. The provision of the restrictor 6c having the orifice 6a of a small diameter as in this embodiment will allow the pressure in the chamber 3 to vary only slightly with respect to a change in gas pressure in the pressure control chamber 8. Therefore, a significant pressure change will not occur on the mask 4, thereby preventing the mask 4 from being deformed significantly or being damaged.

When the pressure control chamber 8 and the restrictor 6c are provided as in the above embodiment, it is sufficient that the difference between the pressure in the pressure control chamber and the atmospheric pressure be controlled at a relatively coarse accuracy on the order of about 1 mmHg as mentioned earlier. Therefore, the differential pressure gauge 9 should not necessarily be a high-precision differential pressure gauge. In other words, the pressure in the chamber 3 can be controlled at a high accuracy greater by a factor of several tens over the prior art as long as the flow-rate control valve 10 and the pressure controller 11 have about the same precision as those of the prior art.

Figure 5:
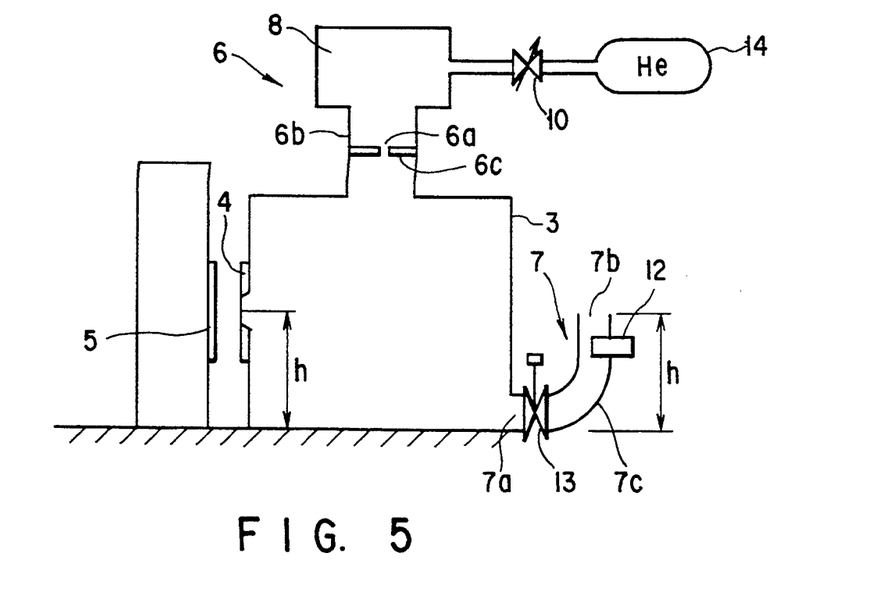
FIG. 5 is a diagram illustrating the schematic structure of an X-ray exposure apparatus having a gas discharging portion with an outlet port located at the same height as a mask according to a further embodiment of this invention.

FIG. 5 shows an embodiment which has both the differential pressure gauge 9 and pressure controller 11 removed from the embodiment in FIG. 4. The flow-rate control valve 10 is manually controlled in this embodiment. Even if the pressure in that chamber 8 is manually adjusted, the restrictor 6c will prevent a large pressure change in the pressure control chamber 8 from being directly transmitted to the chamber 3, and the pressure change would be suppressed by about a factor of 1000 of the actual pressure change in the pressure control chamber 8. This embodiment will therefore sufficiently serve for practical usage, without automatic pressure control involving the differential pressure gauge 9 and pressure controller 11. Since the automatic pressure control mechanism is not employed in this embodiment, the structure of the exposure apparatus will be simplified considerably.

A different embodiment will now be described referring to FIG. 6.

The same reference numerals as used for the embodiment in FIG. 4 will be given to the identical components in this embodiment to avoid repeating their description.

In this embodiment, a pipe 7e extends upward from the side of the bottom portion of the chamber 3 and then extends horizontally. The shield valve 13 and oxygen analyzer 12 are provided at the horizontal portion of this pipe 7e. An outer pipe 7f is provided over a lead pipe 7c that extends downward from the distal end of the pipe 7e. The outer pipe 7f is fitted over the lead pipe 7c in such a manner that the distance between the outlet port of the outer pipe 7f and the bottom of the chamber 3, or the height h from the bottom of the chamber 3 to the outlet port of the outer pipe 7f, equals the height h from the bottom of the chamber 3 to the center position of the mask 4, with the downward opening 7b of the lead pipe 7c located slightly inward from the outlet port of the outer pipe 7f. A helium retainer 7d for surely preventing air diffusion or penetration from the gas discharging portion is therefore formed between the outer pipe 7f and the lead pipe 7c, i.e., around the lead pipe 7c.

With the above structure, gaseous helium coming from the opening 7b rises since it has lighter specific weight than air, and stays in the helium retainer 7d. The gaseous helium retained around the opening 7b will prevent air (oxygen) from entering the chamber 3 through the opening 7b due to diffusion.

As the pipe 7e is bent upward so that a part of the pipe passage of the gas discharging portion 7 is located higher than the opening 7b in consideration of gaseous helium having a smaller density than air, air having a larger specific weight than the gaseous helium, if some enters through the opening 7b, would stay somewhere inside the pipe 7e and would not enter the chamber 3.

As mentioned earlier, the height difference of 1 cm between the outlet port of the gas discharging portion 7 and the center of the X-ray mask 4 generates a pressure difference of about 1/1000 mmHg. Since the height from the bottom of the chamber 3 to the center of the X-ray mask 4 is set nearly equal to the height from the bottom of the chamber 3 to the outlet port of the gas discharging portion 7 or the outlet port of the outer pipe 7f, the difference between the atmospheric pressure and the pressure in the chamber 3 will be kept very low. This prevent the mask 4 from being deformed and damaged.

Figure 6:
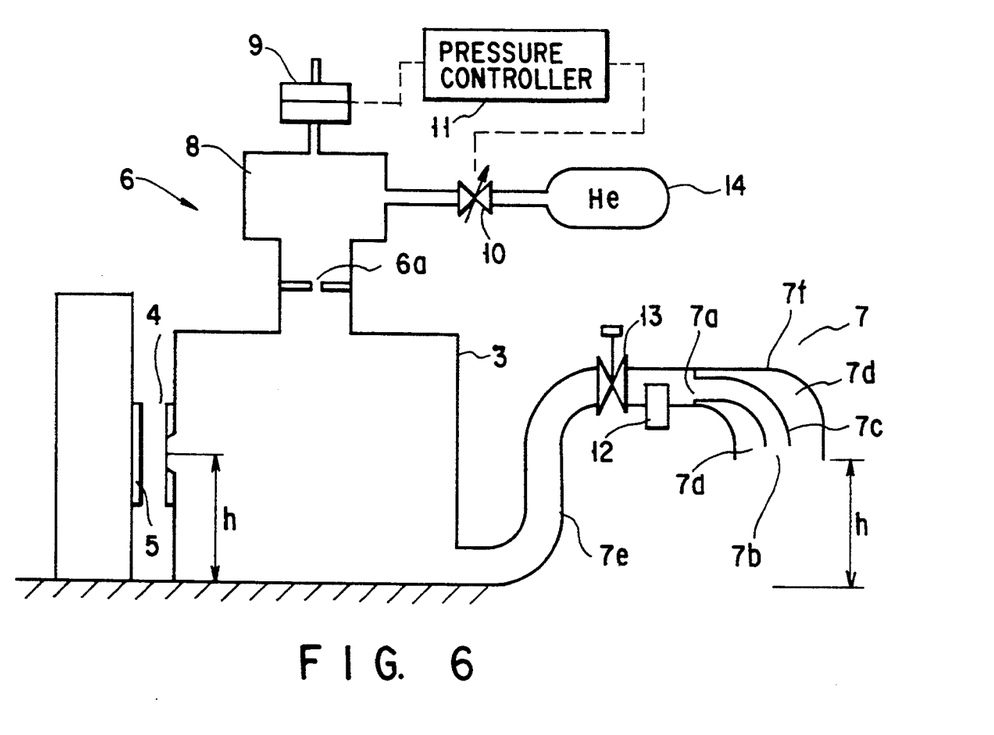
FIG. 6 is a diagram illustrating the schematic structure of an X-ray exposure apparatus having a gas discharging portion with an outlet port located at the same height as a mask according to a still further embodiment of this invention.
Figure 7:
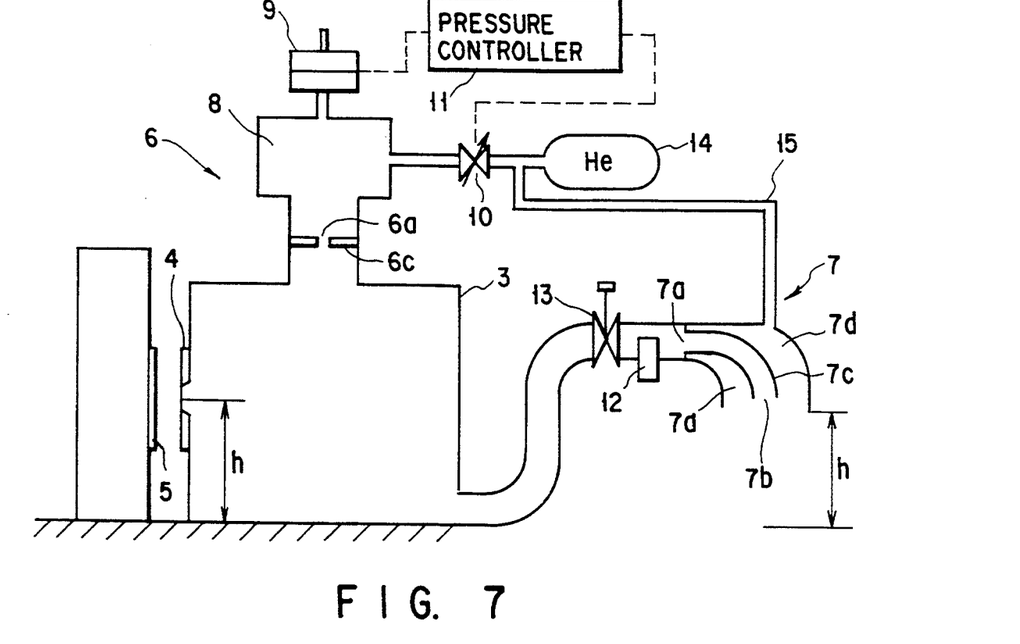
FIG. 7 is a diagram illustrating the schematic structure of an X-ray exposure apparatus having a gas discharging portion with an outlet port located at the same height as a mask according to a yet still further embodiment of this invention.

An embodiment shown in FIG. 7 is the embodiment in FIG. 6 to which a pipe 15 for connecting the helium tank 14 to the helium retainer 7d is added. In other words, the helium tank 14 and the outer pipe 7f are coupled together by the pipe 15, leading gaseous helium in the helium tank 14 to the helium retainer 7d. This structure allows a large amount of gaseous helium to always stay around the opening 7b to purge around the opening 7b with the gaseous helium. It is therefore possible to more surely prevent air (oxygen) from entering the chamber 3 due to diffusion.

Figure 8:
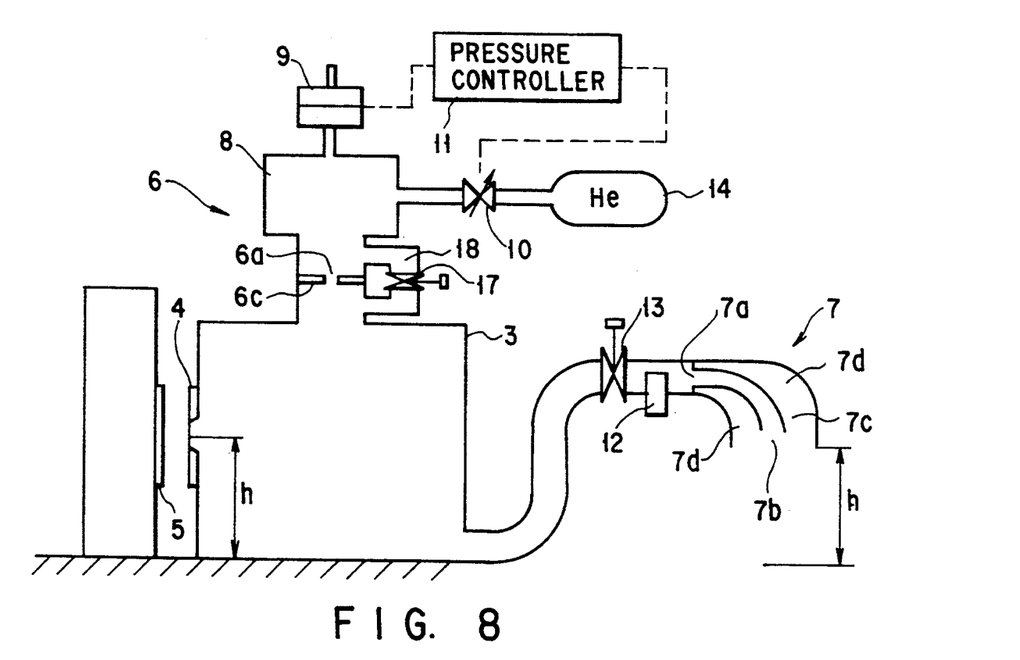
FIG. 8 is a diagram illustrating the schematic structure of an X-ray exposure apparatus having a gas discharging portion with an outlet port located at the same height as a mask according to a yet still further embodiment of this invention.

An embodiment shown in FIG. 8 has a shield valve 17 provided at the gas supplying portion 6 in the embodiment in FIG. 6. More specifically, the shield valve 17 is attached, adjacent to the orifice 6a, to the restrictor 6 provided in the pipe 6b of the gas supplying portion 6, and a bypass passage 18 including the shield valve 17 is provided in the pipe 6b. With this structure, to fill inside the chamber 3 with gaseous helium at the time the exposure apparatus is activated, the shield valve 17 is opened to supply a large amount of gaseous helium via the bypass passage 18 to the chamber 3 from the helium tank 14, filling inside the chamber 3 with the gaseous helium in a short period of time.

Figure 9:
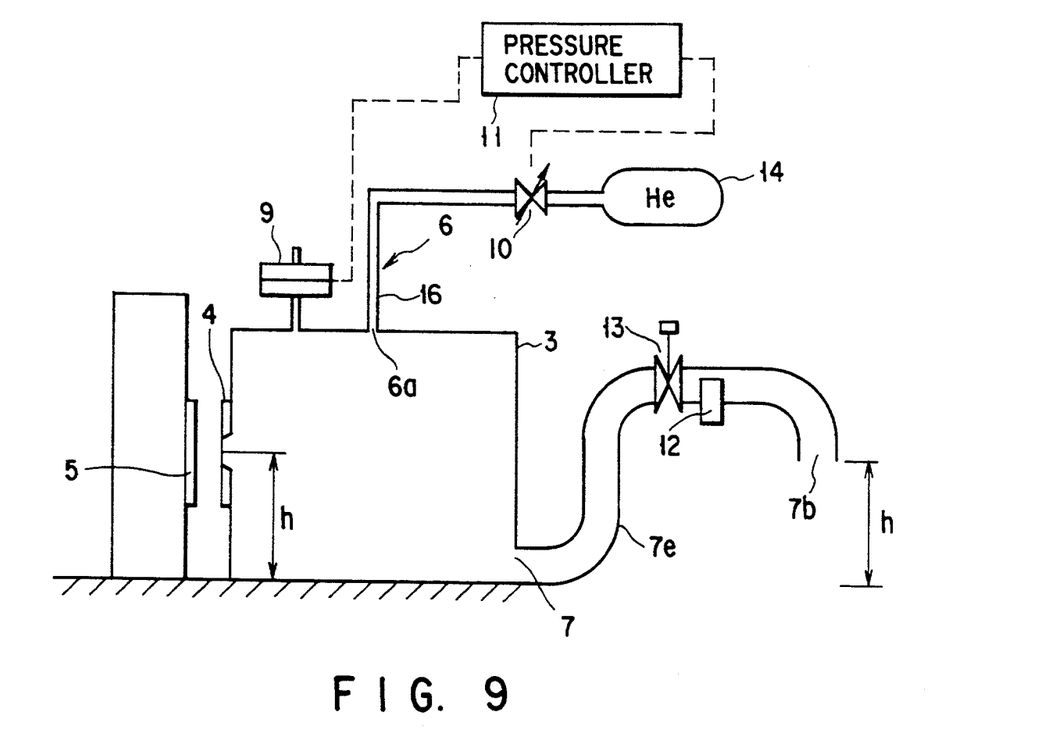
FIG. 9 is a diagram illustrating the schematic structure of an X-ray exposure apparatus having a gas discharging portion with an outlet port located at the same height as a mask according to a yet still further embodiment of this invention.

A further embodiment will be described below with reference to FIG. 9.

In this embodiment, the differential pressure gauge 9 is directly coupled to the chamber 3 so as to directly measure the pressure in the chamber 3. In this case, the differential pressure gauge 9 in use should be a relatively high-precision type which can measure the difference between the pressure in the chamber 3 and the atmospheric pressure on the order of a predetermined pressure difference of $10^{-3}$ mmHg. Further, the helium tank 14 is coupled via the flow-rate control valve 10 to the chamber 3 by the pipe 16 which constitutes the gas supplying portion 6.

In this embodiment too, the pipe 7e of the gas discharging portion 7 extends upward from the side of the bottom portion of the chamber 3 and then extends horizontally. The distal end of the pipe 7e is bent downward to form the downward opening 7b. In this case, the height from the bottom of the chamber 3 to the center position of the mask 4 is set equal to the height from the bottom of the chamber 3 to the opening 7b of the gas discharging portion 7. Further, the shield valve 13 and oxygen analyzer 12 are attached to the horizontal portion of this pipe 7e.

Figure 10:
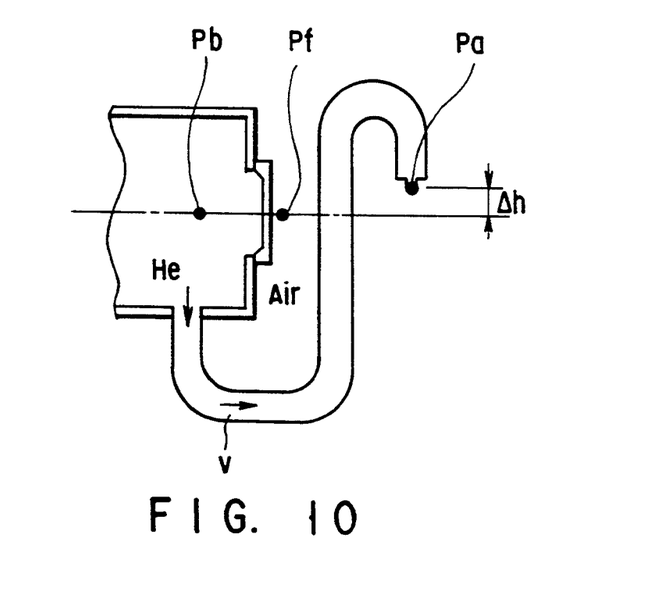
FIG. 10 is a diagram for explaining the relation among chamber pressure, atmospheric pressure and pressure at the outlet port.

Although it has been just mentioned that the height h from the bottom of the chamber to the opening 7b of the gas discharging portion 7 is set equal to the height from the bottom of the chamber 3 to the center position of the mask 4 in this embodiment, strictly speaking, the relation among the pressures at the individual points shown in FIG. 10 is expressed by the following equations in consideration of the resistance component of the pipe.

$$P_f = P_a + \gamma_{air}\Delta$$

$$p_b = P_a + \gamma He\Delta h + \zeta(\gamma He/2)v^2$$

$$P_b - P_f = -(\gamma_{air} - \gamma He)\cdot\Delta h + \zeta(\gamma He/2)$$

where $\zeta(\gamma He/2)v^2$ is the resistance component of the pipe.

Figure 11:
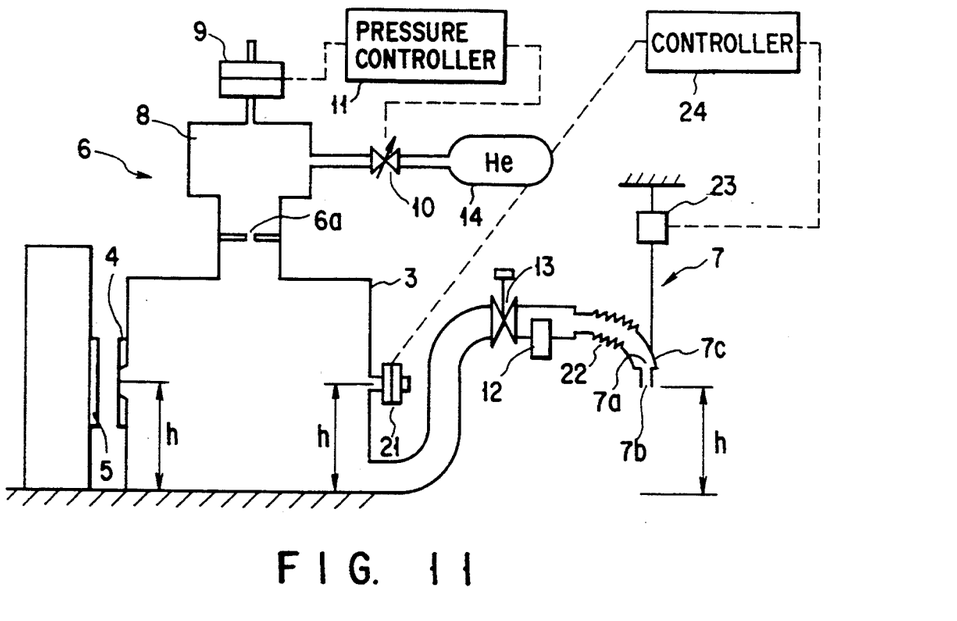
FIG. 11 is a diagram illustrating the schematic structure of an X-ray exposure apparatus having a gas discharging portion with an outlet port located at the same height as a mask according to a yet still further embodiment of this invention.

It is desirable that the height from the bottom of the chamber 3 to the opening 7b be made variable to cancel the resistance component of the pipe. FIG. 11 shows an embodiment which has this height changing function.

As shown in FIG. 11, a pressure gauge 21 is attached to the side of the chamber 3 at the same height from the bottom of the chamber 3 as that therefrom to the center of the mask 4. This pressure gauge 21 may be a sensor which is attached to the side of the chamber 3 to detect the amount of deformation of the measuring mask that has the same characteristic as the mask 4.

A flexible pipe 22 is connected to the distal end of the gas discharging portion 7, and the lead pipe 7c having the opening 7b is provided downward at the distal end of this flexible pipe 22. The distal end of the lead pipe 7c is coupled to a driving mechanism 23, and moves up and down by the action of the flexible pipe 22 in accordance with the movement of the shaft of the driving mechanism 23. The driving mechanism 23 is connected to a controller 24, which controls the mechanism 23 in accordance with the pressure detected by the pressure gauge 21 to automatically adjust the distance between the bottom of the chamber 3 and the opening 7b according to the detected pressure.

As the height from the bottom of the chamber 3 to the opening 7b has only to be adjusted at the time of initializing the exposure apparatus, the height to the opening 7b may be fixed or unchangeable during operation.

While the same reference numerals as used for the previous embodiment are given to the identical components in the embodiment of FIG. 11 to avoid repeating their description, those components have the same structures and perform the same functions as those of the previous embodiment.

Figure 12:
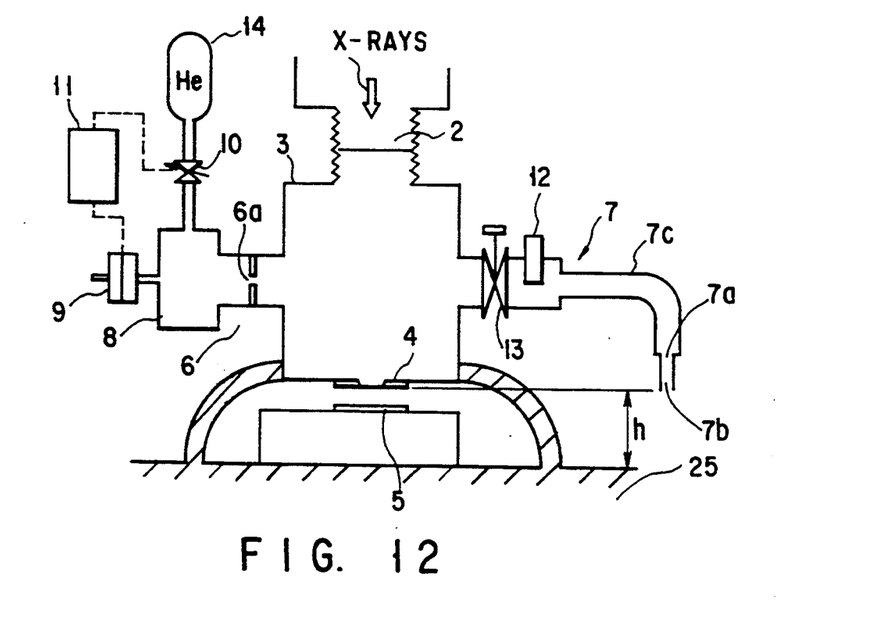
FIG. 12 is a diagram illustrating the schematic structure of an X-ray exposure apparatus having a gas discharging portion with an outlet port located at the same height as a mask according to a yet still further embodiment of this invention.

Although the foregoing description of the individual embodiments has been given with reference to the case where the X-ray mask is disposed vertically, this invention may be adapted for an exposure apparatus where the X-ray mask 4 is disposed horizontally, as shown in FIG. 12.

More specifically, the X-ray mask 4 is attached horizontally to the bottom of the chamber 3, and the X-ray window 2 is provided in that top portion of the chamber 3 which faces this mask 4. The gas supplying portion 7, pressure control chamber 8, differential pressure gauge 9, flow-rate control valve 10, pressure controller 11 and helium tank 14 are provided at one side portion of the chamber 3 (left-hand side in the diagram) with the same connecting relation as the previous embodiments. The gas discharging portion 7 is arranged on the opposite side of the chamber 3 (right-hand side in the diagram). The distal end of the lead pipe 7c of the gas discharging portion 7 is bent downward, and the distance between the opening 7b at the distal end and a mounting table 25 or the height h from the mounting table 25 to the opening 7b is set equal to the distal between the surface of the mask 4 and the mounting table 25 or the height h from the mounting table 25 to the mask 4.

In this embodiment too, since the height h to the opening 7b is set about the same as the height to the mask, the pressure in the chamber 3 becomes approximately equal to the atmospheric pressure as per the above-described embodiments. Accordingly, the X-ray mask 4 will hardly deform, so that adequate exposure will be accomplished at a sufficiently high accuracy even in the case of close exposure with the gap of about 30 $\mu$m set between the mask 4 and the wafer 5.

Although the gas supplying portion 6 and gas discharging portion 7 have each been explained as a single line in the foregoing description of the individual embodiments, at least one of the gas supplying portion 6 and gas discharging portion 7 may branch to a plurality of lines. In this case, the total area of the cross sections of the divided gas flow passages should be set in such a way that the total cross-sectional area of the gas discharging portion 7 is greater than that of the gas supplying portion 6 to meet the above-described conditions.

The cross-sectional shapes of the gas flow passages of the gas supplying portion 6 and gas discharging portion 7 are not limited to a circle, but may take various other forms, such as a rectangle and an ellipsoid.

Although the oxygen analyzer 12 is provided at the gas discharging portion 7, the oxygen analyzer 12 may be disposed inside the chamber 3 so that it can directly measure the oxygen concentration inside the chamber 3 of interest.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An X-ray exposure apparatus comprising:

X-ray generating means for generating X-rays;

a main chamber having an X-ray window for passing said X-rays and an X-ray mask attached thereto facing said X-ray window, and filled with X-ray low attenuation gas, for guiding said X-rays from said X-ray window to said X-ray mask;

gas supplying means for supplying X-ray low attenuation gas into said main chamber and having a portion with a small-diameter passage cross section formed at least at a part thereof;

gas discharging means for discharging gas from said main chamber and having a portion with a small-diameter passage cross section formed at least at a part thereof; and flow-rate control means for controlling a flow rate of gas to be supplied to said gas supplying means to thereby control pressure in said main chamber, and wherein a diameter of said small-diameter portion of said gas supplying means is set at a value smaller than that of said gas discharging means so that pressure in said main chamber is substantially equal atmospheric pressure.

2. The X-ray exposure apparatus according to claim 1, wherein said gas supplying means includes a pressure control chamber whose internal pressure is controllable and a restrictor provided between said pressure control chamber and said main chamber and having an orifice of a predetermined diameter, and said gas discharging means has a gas discharging passage connected to said main chamber and wider than said diameter of said orifice.

3. The X-ray exposure apparatus according to claim 2, wherein said gas supplying means has a differential pressure gauge attached to said pressure control chamber for measuring a difference between pressure in said pressure control chamber and atmospheric pressure, and flow-rate control means for controlling a flow rate of gas to be supplied to said pressure control chamber, based on a signal output from said differential pressure gauge.

4. The X-ray exposure apparatus according to claim 1, wherein said gas supplying means has a pipe coupled to said main chamber to supply said gas thereto and narrower than said small-diameter portion of said gas discharging means.

5. The X-ray exposure apparatus according to claim 1, wherein said gas discharging means has a pipe connected to said main chamber and a shield valve provided between said pipe and said main chamber for closing said pipe.

6. The X-ray exposure apparatus according to claim 1, wherein said gas discharging means has a pipe connected to said main chamber and an oxygen analyzer for measuring an amount of oxygen in said pipe.

7. The X-ray exposure apparatus according to claim 1, wherein said gas discharging means has a pipe connected to said main chamber, and an outer tube provided around said pipe, with a gas retainer formed between said pipe and said outer tube.

8. The X-ray exposure apparatus according to claim 1, wherein said gas supplying means has a gas tank and a pipe for coupling said gas tank to said gas retainer.

9. The X-ray exposure apparatus according to claim 1, wherein said gas supplying means has bypass means for supplying a large amount of gas in said main chamber at a time of activating said X-ray exposure apparatus.

10. The X-ray exposure apparatus according to claim 1, wherein said gas discharging means has a pipe connected to a vicinity of a bottom portion off said main chamber, and having a gas outlet port extending upward and then bent to be open downward.

11. An X-ray exposure apparatus comprising:

X-ray generating means for generating X-rays;

a main chamber having an X-ray window for passing said X-rays and an X-ray mask attached thereto facing said X-ray window, and filled with X-ray low attenuation gas for guiding said X-rays from said X-ray window to said X-ray mask;

gas supplying means for supplying X-ray low attenuation gas into said main chamber and having a first portion with a small-diameter passage cross section formed at least at a part thereof:

gas discharging means for discharging gas from said main chamber and having a second portion with a small-diameter passage across section formed at least at a part thereof, said second portion of said gas discharging means having a larger passage cross section than said first portion; and flow-rate control means for controlling a flow rate of gas to be supplied to said gas supplying means to thereby control pressure in said main chamber.

12. The X-ray exposure apparatus according to claim 11, wherein said gas supplying means includes a pressure control chamber whose internal pressure is controllable and a restrictor disposed between said pressure control chamber and said main chamber and having an orifice of a predetermined diameter, and said gas discharging means has a gas discharging passage connected to said main chamber and having a larger diameter than said diameter of said orifice.

* * * * *